SPECTRUM CONTROLLED FREQUENCY SYNTHESIZER SYSTEM

Filed April 3, 1964

INVENTORS
FLOYD A. KOONTZ
THOMAS B. MICHAELS
BY Martin [signature]
ATTORNEY

United States Patent Office 3,379,995

Patented Apr. 23, 1968

3,379,995

SPECTRUM CONTROLLED FREQUENCY SYNTHESIZER SYSTEM

Floyd A. Koontz and Thomas B. Michaels, Monroe, N.Y., assignors to General Dynamics Corporation, a corporation of Delaware Filed Apr. 3, 1964, Ser. No. 357,062

8 Claims. (Cl. 331—19)

ABSTRACT OF THE DISCLOSURE

Described herein is a system for controlling the frequency of a spectrum generator so that it and a variable frequency oscillator are locked both in frequency and phase. A variable direct current signal is applied to the tuning networks of both the spectrum generator and the oscillator and the outputs of the generator and oscillator are compared in a phase detector which provides an error signal which locks the oscillator to the desired spectrum component.

This invention relates to frequency control systems, and particularly to frequency synthesizer systems which can generate signals of selected frequencies for injection into frequency translators of communication apparatus, such as radio receivers and transmitters.

The invention is also useful in the generation of a spectrum of related frequency components, which spectrum is especially suitable for use in frequency synthesizer systems.

In frequency synthesizer systems, where many precise, stable injection frequency signals are desired, a spectrum of harmonically related frequencies may be derived from a standard or reference frequency source. A variable frequency oscillator which generates the synthesizer output signals is locked to a particular frequency component of the spectrum so that the output signal is controlled precisely by the standard or reference frequency source. The variable frequency generator may lock on the wrong spectrum component, particularly if the desired spectrum component is one of relatively low power as compared to other spectrum components or if the locking range of the oscillator is limited.

It is therefore an object of the present invention to provide an improved frequency synthesizer system wherein the foregoing disadvantages are obviated.

It is a further object of the present invention to provide an improved spectrum generator which provides high power spectrum components in desired frequency regions.

It is a still further object of the present invention to provide an improved, tunable spectrum generator.

It is still a further object of the invention to provide an improved spectrum generator which is both tunable and capable of providing a substantial number of high power, spectrum components precisely located in frequency.

It is a still further object of the present invention to provide an improved frequency synthesizer which is adapted to be frequency controlled by D.C. voltages.

Briefly described, frequency synthesizer embodying the invention includes a variable frequency oscillator which produces outut signals for injection into a frequency translator. A spectrum generator operated by a standard frequency source generates a plurality of spectrum components. A phase detector responsive to the oscillator output signal and the spectrum controls the oscillator and locks the output signal in frequency and phase to a spectrum component closest thereto in frequency. The spectrum generator and oscillator are both tunable together to track the spectrum frequency band and the frequency of the output signal with each other. Thus, a spectrum component of high power is always available to lock the oscillator to precisely the desired frequency. The spectrum generator may include a resonant circuit which is repetitively connected to an amplifier to form an oscillator. Bursts of oscillatory energy are provided upon each connection and contain a large number of high power spectrum components. A capacitive circuit connected to the input of the amplifier effectively isolates the input impedance of the amplifier from the resonant circuit and permits a variation of the resonant frequency of the circuit, electrically if desired, so that the spectrum generator may be tuned in step with the variable frequency oscillator.

The invention itself, both as to its organization and method of operation, as well as additional objects and advantages thereof, will become more readily apparent from a reading of the following description in connection with the accompanying drawings in which.

Figure 3:
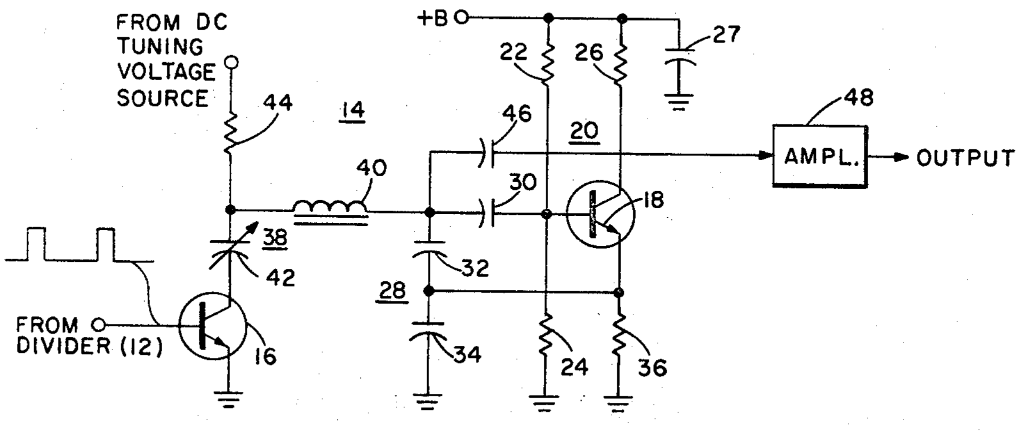
FIG. 3 is a schematic diagram of the spectrum generator shown in FIG. 1.

Referring more particularly to the drawings, a frequency standard 10, such as a crystal oscillator in a temperature controlled oven, provides oscillations of a certain frequency which are divided in frequency by a frequency divider 12. The frequency divider may divide by one hundred, oscillations at one megacycle per second from the frequency standard. The divider provides a ten kc. output signal for triggering or keying a spectrum generator 14. The divider may include pulse forming circuits so as to provide keying pulses having sharp leading and lagging edges. The spectrum generator 14 is shown in FIG. 3 and the input pulses from the divider 12 are shown adjacent to the base of a transistor 16 which forms a keying switch of the spectrum generator.

The spectrum generator 14 includes a transistor 18 in an amplifier circuit 20. Operating voltages are supplied to the circuit from a source indicated as +B, the low potential side of which may be connected to a point of reference potential, such as ground. Bias potentials for the transistor are provided by means of a voltage divider including a pair of resistors 22 and 24 connected from +B to ground. The junction of the resistors 22 and 24 is connected to the base of the transistor 18. Collector voltage is applied to the collector of the transistor 18 through a resistor 26. A decoupling capacitor 27 is connected from +B to ground. A capacitor circuit including a capacitive voltage divider 28 and a coupling capacitor 30 is connected to the base of the transistor 18. The capacitive voltage divider 28 includes two capacitors 32 and 34, the junction of which is connected to the emitter of the transistor 18 and to ground by way of an emitter resistor 36. The capacitors 32 and 34 and the coupling capacitor 30 present much lower impedance between the base of the transistor and ground than is presented by the base to emitter circuit of the transistor 18 itself. Accordingly the capacitive circuit effectively isolates the transistor capacitance from a resonant circuit 38 that can be connected, through the coupling capacitor circuit 30, to the base of the transistor 18.

The series resonant circuit 38 includes an inductor 40 and a variable capacitance element 42, which can be a known type of semiconductor diode. The capacitance of this device 42 may be varied by a direct current voltage applied thereto by way of a resistor 44. The resonant circuit is completed to ground by the emitter-collector path of the keying transistor 16. When a keying pulse is applied to the base of the transistor 16, the transistor 16 saturates and effectively connects the resonant circuit 38 to ground. When the resonant circuit is connected to the amplifier 20, that amplifier is converted into an oscillator of the Colpitts type, which functions as a spectrum generator and produces a burst of oscillation at a frequency established by the resonant circuit 38.

The keying circuit including the transistor 16 is effectively isolated from the transistor 18 since it is included in the resonant or tuned circuit of the spectrum generator. The keying transistor 16 is connected in the resonant circuit 38 and no appreciable D.C. current flows in the resonant circuit. Thus the input capacitance of the transistor 18 does not delay or otherwise distort the keying pulse. The keying pulse therefore has a very short rise time and a very short decay time thereby insuring a spectrum having a large quantity of high power components in response to the application of the keying pulses from the divider 12. Since the spectrum generator is keyed at the reference frequency of the divider 12 output, the spectrum components will be separated by that reference frequency.

The amplifier output is coupled through a coupling capacitor 46 to an amplifier 48, which may be of the emitter follower type. The output of the spectrum generator 14 is obtained from the amplifier 48.

Figure 1:
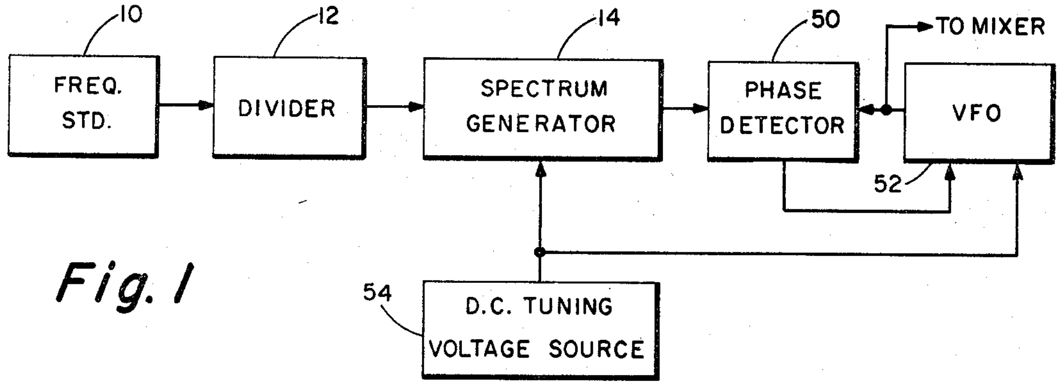
FIG. 1 is a block diagram of a frequency synthesizer system embodying the invention.

A phase detector 50 (see FIG. 1) compares the output of the spectrum generator 14 which the output of a variable frequency oscillator 52. This oscillator 52 may be of the low input impedance Colpitts type similar to the oscillator of the spectrum generator 14 and may include a voltage variable capacitor, the capacitance of which may be varied in accordance with the amplitude of a direct current tuning voltage applied thereto. This tuning voltage may be obtained from a source 54 which is connected simultaneously both to the resistor 44 of the spectrum generator (see FIG. 3) and to the variable capacitance element in the variable frequency oscillator 52, for example by way of a resistor as in the spectrum generator. Thus the frequency of the variable frequency oscillator and the center frequency of the spectrum, generated in the spectrum generator, may be made to track each other. Since the higher power components of the spectrum are approximately at the center frequency of the oscillator defined by the circuit of the spectrum generator, high power components of the spectrum will be presented to the phase detector 50 for comparison with the output of the variable frequency oscillator 52. The center frequency component of the spectrum can differ from the oscillator 52 output signal by less than one-half the frequency of the keying reference signals. Any deviation in frequency and or phase of the output of the oscillator 52 from the one spectrum components, closest to that output in frequency will cause the phase detector to produce an error voltage. This error voltage may be applied to one side of the voltage variable capacitor in the oscillator 52 while the D.C. tuning voltage is applied to the opposite side of that capacitor. The phase detector 50 thereby rapidly locks the oscillator frequency to the desired spectrum component frequency. The oscillator frequency and the spectrum generator center frequency are coarsely set close to each other by the voltage from the D.C. tuning source 54.

The output of the oscillator 52 may be applied to the frequency translator (mixer) of a radio transmitter or receiver.

Figure 2:
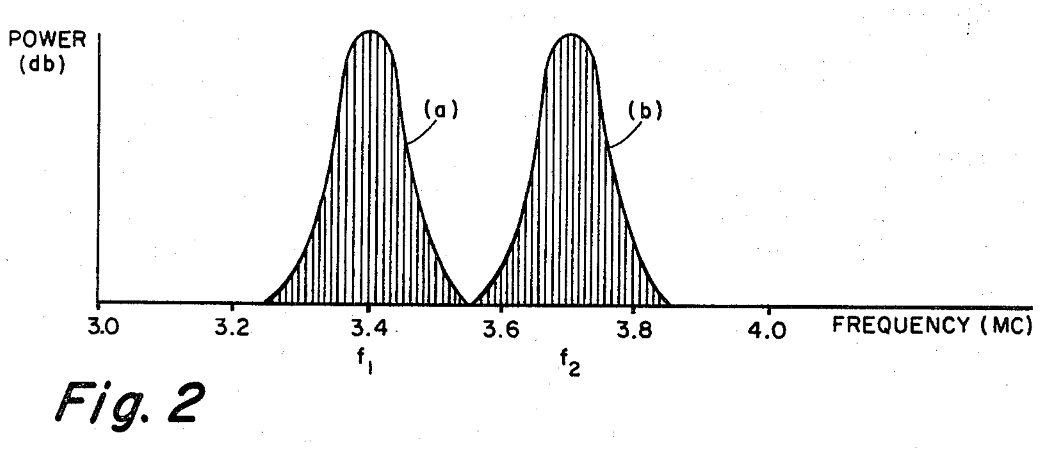
FIG. 2 is a graph showing the spectrum output of the spectrum generator of the system of FIG. 1.

FIG. 2 shows in essence the spectrum output of the spectrum generator 14 in two cases; (*a*) and (*b*) when the spectrum generator is tuned to two frequencies $f_1$ and $f_2$ indicated as 3.4 mc. and 3.7 mc.

From the foregoing description it will be apparent that there has been provided an improved spectrum generator and an improved frequency synthesizer system which are adapted to provide frequency control of the electrical apparatus, such as a radio set. While an exemplary frequency synthesizer system and an exemplary spectrum generator circuit embodying the invention have been described herein, variations in the system and in the circuit within the scope of the invention, will undoubtedly become apparent to those skilled in the arts. Accordingly, the foregoing description should be taken merely as illustrative and not in any limiting sense.

What is claimed is:

1. A frequency synthesizer system comprising (a) a variable frequency oscillator which provides injection frequency signals for use in a mixer,
(b) means for varying the frequency of said oscillator,
(c) means for generating a series of bursts of oscillations each simultaneously containing a spectrum of high stable reference frequency signals, said spectrum including a plurality of signal components of different frequency all within a given frequency range,
(d) means responsive to said spectrum for controlling the frequency of said oscillator, and
(e) means responsive to said oscillator frequency varying means operative to shift said frequency range of said spectrum of signal components to track the frequency of said injection frequency signals.

2. A frequency synthesizer system comprising (a) a variable frequency oscillator for providing an output signal having different frequencies over a range of frequencies,
(b) means for generating a series of successively occurring bursts of oscillations each simultaneously containing a spectrum of highly stable reference frequency components, said spectrum extending over a band of frequencies in said range,
(c) means for tracking the spectrum and said oscillator in frequency with each other, and
(d) means varying, over said range, the frequency of said output signal and shifting of said band of said spectrum in relation with each other so that said output signal and higher power frequency components of said spectrum are continually within locking range of each other.

3. A frequency synthesizer system comprising (a) a variable frequency oscillator for providing an output signal of different frequencies over a frequency range,
(b) a source of highly stable reference frequency signals,
(c) a spectrum generator coupled to said source and keyed by said signals from said source for providing a series of bursts of oscillations repetitive at the same frequency as the signals from said source and each of said bursts simultaneously containing a spectrum of frequency components, said components being spaced from each other in frequency by the same frequency as said signals from said source, said components occupying a region in said range,
(d) means included in said generator for shifting said frequency region occupied by said spectrum,
(e) means responsive to said spectrum and said output signal for locking said output signal and one of said spectrum components in phase with each other, and
(f) means coupled to said oscillator and said frequency region shifting means for simultaneously varying the frequency of said output signal and shifting the frequency region occupied by said spectrum in step with each other.

4. A frequency synthesizer system comprising (a) a variable frequency oscillator for providing injection frequency output signals for use in a mixer of a radio set,
(b) a source of reference signals,
(c) a spectrum generator including
    (1) an oscillator, (2) a variable reactance element included in said generator oscillator for varying the frequency thereof, and (3) means responsive to said reference signals for keying said generator oscillator to generate a series of bursts of oscillation having a repetition rate equal to the frequency of said reference signals, each of said bursts simultaneously containing a spectrum of frequency components in a band centered at the frequency of oscillation of said generator oscillator, (d) a phase locking lop including a phase detector responsive to said spectrum components and to said variable injection frequency signals for providing an output for locking said variable frequency oscillator output signals in phase with the one of said spectrum components closest thereto in frequency, and (e) means for simultaneously changing the frequency of said variable frequency oscillator and the reactance presented by said variable reactance element so that said output signal and the center frequency component of said spectrum differ from each other in frequency by less than one-half the frequency of said reference signals.

5. In combination, an amplifier having an input and an output, a feedback connection between said input and said output, a series circuit including a resonant circuit, and switch means including an active element switching device, said series circuit being connected to said input, a source of regularly repetitive keying signals coupled to said active element for operating said switching device from open to closed condition upon occurrence of each of said keying signals for repetitively connecting said resonant circuit to said input and converting said amplifier to an oscillator which generates repetitive bursts of oscillations at the resonant frequency of said resonant circuit, each of said bursts simultaneously containing a spectrum of frequency components separated in frequency by a frequency equal to the keying rate of said keying signals.

6. A spectrum generator comprising an amplifier with a control electrode, an output electrode and a common electrode, a resonant tank circuit comprising a capacitive voltage divider in parallel with a series circuit including an inductor and an active element switch device, said common electrode being coupled to an intermediate point on said divider, a source of regularly repetitive pulses connected to said active element for driving said switch device from its closed to its open condition on occurrence of each pulse from said source at the repetition rate of said pulses from said source, and said control and output electrodes being coupled, respectively, to opposite ends of the tank circuit to apply exciting voltage of the proper phase to the control electrode to generate bursts of oscillation each time when said switch is closed, said bursts each simultaneously containing a spectrum of frequency components separated in frequency by a frequency equal to the repetition rate of said pulse from said source.

7. A spectrum generator comprising (a) a transistor having output, common and control electrodes, (b) means for applying operating voltages to said electrodes, (c) a capacitive circuit connected between said control and common electrodes which presents a much lower impedance than the impedance presented by said transistor between said common and control electrodes thereof, (d) said capacitive circuit also providing feedback to said control electrode of signals present at said common electrode, (e) an inductor, capacitive element and a switching transistor connected in series with each other across said capacitive circuit for defining with said capacitive circuit and said transistor, an oscillator when said switching transistor is conductive, and (f) means for applying regularly repetitive pulses to the control electrode of said switching transistor for rendering said switching transistor conductive only for the duration of each of said pulses whereby said oscillator is operative to provide a series of successive bursts of oscillation repetitive at the repetition rate of said pulses, each of said bursts simultaneously containing a spectrum of frequency components separated by a frequency equal to said repetition rate.

8. The invention as set forth in claim 7 wherein said capacitive element is a voltage variable capacitor device, and including means for applying a D.C. voltage to said device to vary the capacitance thereof and the frequency of said oscillator.

References Cited

UNITED STATES PATENTS

| | | | |
|---|---|---|---|
| 2,930,991 | 3/1960 | Edwards | 331—170 |
| 3,049,626 | 8/1962 | Shannon | 307—88.5 |
| 3,177,442 | 4/1965 | Halverson | 331—19 |

FOREIGN PATENTS 1,119,927 12/1961 Germany.

JOHN KOMINSKI, *Primary Examiner.*